US009722746B2

(12) United States Patent
Ho et al.

(10) Patent No.: US 9,722,746 B2
(45) Date of Patent: Aug. 1, 2017

(54) ANALOG-TO-DIGITAL CONVERTER WITH BANDPASS NOISE TRANSFER FUNCTION

(71) Applicant: MediaTek Inc., Hsin-Chu (TW)

(72) Inventors: Stacy Ho, Reading, MA (US); Wei-Hsin Tseng, Changhua (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/165,088

(22) Filed: May 26, 2016

(65) Prior Publication Data

US 2017/0085349 A1 Mar. 23, 2017

Related U.S. Application Data

(60) Provisional application No. 62/221,938, filed on Sep. 22, 2015.

(51) Int. Cl.
| | | |
|---|---|---|
| *H04L 5/00* | (2006.01) | |
| *H04B 1/12* | (2006.01) | |
| *H03M 1/46* | (2006.01) | |
| *H03M 1/06* | (2006.01) | |
| *H03M 3/00* | (2006.01) | |
| *H04B 1/00* | (2006.01) | |
| *H04L 27/26* | (2006.01) | |

(52) U.S. Cl.
CPC ........ *H04L 5/0041* (2013.01); *H03M 1/0617* (2013.01); *H03M 1/466* (2013.01); *H03M 3/406* (2013.01); *H03M 3/41* (2013.01); *H03M 3/426* (2013.01); *H03M 3/47* (2013.01); *H04B 1/0075* (2013.01); *H04B 1/123* (2013.01); *H04L 5/001* (2013.01); *H04L 27/2647* (2013.01)

(58) Field of Classification Search
CPC .......................... H04L 27/2647; H04L 5/0041
USPC ............... 455/307, 296, 306, 310, 311, 339; 180/155, 118, 122, 120, 144, 110, 126, 180/123
See application file for complete search history.

(56) References Cited

U.S. PATENT DOCUMENTS 9,425,818 B1 * 8/2016 Rajaee .................... H03M 3/32

OTHER PUBLICATIONS

Fredenburg et al., "A 90MS/s 11MHz Bandwidth 62dB SNDR Noise-Shaping SAR ADC", ISSCC 2012/ Session 27/ Data Converter Techniques/27.6, 2012 UEEE International Solid-State Circuits Conference, University of Michigan, Ann Arbor, MI, 3 pages.
Tabatabaei et al., "A Wideband Bandpass Sigma-Delta Modulator for Wireless Applications*", Symposium on VLSI Circuits Digest of Technical Papers 1999, 91-92.
Extended European Search Report for Application No. EP 16189537.1 dated Feb. 15, 2017.

(Continued)

*Primary Examiner* — Keith Ferguson
(74) *Attorney, Agent, or Firm* — Wolf, Greenfield & Sacks, P.C.

(57) ABSTRACT

Methods and apparatus for providing bandpass analog to digital conversion (ADC) in RF receiver circuitry of a wireless-communication device. The bandpass ADC includes first noise-shaping successive approximation register (NS-SAR) circuitry arranged in a first path and second NS-SAR circuitry arranged in a second path parallel to the first path, wherein the first and second NS-SAR circuitries are configured to alternately sample an analog input voltage at a particular sampling rate and to output a digital voltage at the particular sampling rate.

20 Claims, 4 Drawing Sheets

(56) References Cited

OTHER PUBLICATIONS

Fredenburg et al., A 90-MS/s 11-MHz-Bandwidth 62-dB SNDR Noise-Shaping SAR ADC. IEEE Journal of Solid-State Circuits. Dec. 2012;47(12):2898-904.

Hwu et al., An RF receiver for Intra-Band carrier aggregation. IEEE Journal of Solid-State Circuits. Apr. 2015;50(4):946-61.

Nguyen et al., Advantages of High-Pass ΔΣ modulators in interleaved ΔΣ analog to digital converter. The 2002 45$^{th}$ Midwest Symposium on Circuits and Systems (IEEE). 2002;(1):I-136-139.

* cited by examiner

FIG. 1A  2-DL CA, contiguous Intra-band (CA_7)

FIG. 1B  3-DL CA, contiguous Intra-band (CA_41)

FIG. 1C  2-DL CA, non-contiguous Intra-band (CA_25-25)

FIG. 1D  3-DL CA Inter-band + Non-contiguous Intraband (2+2+13)

FIG. 1E  2-DL CA Inter-band (CA_8-20)

FIG. 1F  3-DL CA Inter-band (2+17+30)

ANALOG-TO-DIGITAL CONVERTER WITH BANDPASS NOISE TRANSFER FUNCTION

CROSS REFERENCE TO RELATED APPLICATIONS

This application claims priority to U.S. Provisional Application Ser. No. 62/221,938, titled "Band-Pass ADC Using Two-Path Time-Interleaved Noise-Shaping SAR ADC" filed Sep. 22, 2015, which is hereby incorporated by reference in its entirety.

BACKGROUND

The increasing demand for higher data rates in cellular communications has led to the introduction of carrier aggregation as part of the 3GPP Long-Term Evolution (LTE) standard. Carrier aggregation is a technique where multiple component carriers are allocated to a user device to increase the bandwidth available for data communications, thereby increasing the data throughput for the device. The bandwidth of each of the component carriers may be between 1.4-20 MHz, and according to the LTE-Advanced (LTE-A) standard, up to five component carriers can be aggregated resulting in a maximum aggregated bandwidth of 100 MHz. In practice, most cellular service operators that support carrier aggregation aggregate two or at most three component carriers, though it is expected that more than three component carriers may be aggregated in the future if even wider bandwidths are needed or desired.

Figure 1A:
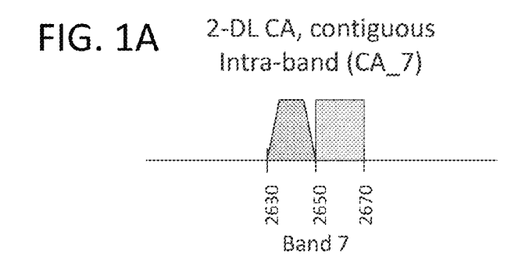
FIGS. 1A-1F show examples of carrier aggregation schemes that may be used to provide increased bandwidths for wireless data communications.
Figure 1B:
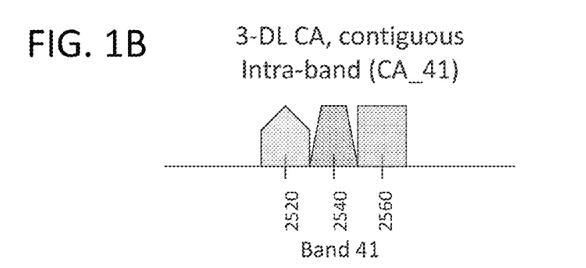

Several schemes are possible for selecting the component carriers and their bandwidths for carrier aggregation as outlined in the LTE and LTE-A standards. As shown in FIGS. 1A and 1B, in an intra-band contiguous scheme, multiple component carriers contiguous within the same operating frequency band are aggregated. In the example of FIG. 1A, two contiguous carriers, each of which has a 20 MHz bandwidth in the same operating frequency (identified as band 7), are aggregated. FIG. 1B shows a carrier aggregation scheme where three contiguous 20 MHz bandwidth carriers in the same frequency operating band (identified as band 41) are aggregated.

Figure 1C:
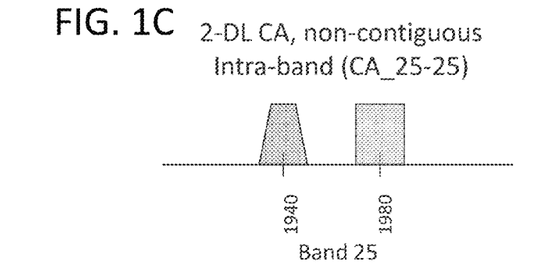

Intra-band carrier aggregation of contiguous component carriers is not always possible based on how cellular service operators allocate operating frequencies. When contiguous component carriers are not available, carrier aggregation may be performed using component carriers that are not contiguous in the same operating frequency band. FIG. 1C illustrates an example of intra-band non-contiguous carrier aggregation in which two component carriers from the same operating frequency band (identified as band 25) are used. The two component carriers are each of 20 MHz bandwidth, but are not contiguous because they are separated by a gap of 20 MHz.

Figure 1D:
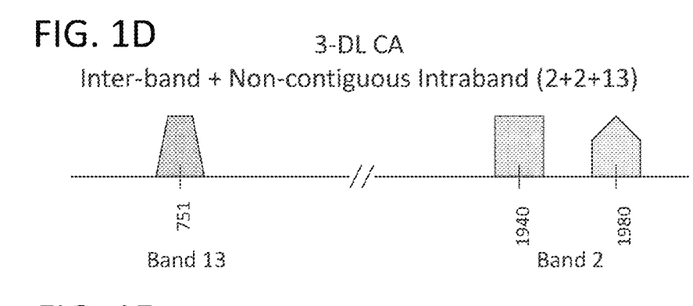

Another carrier aggregation scheme is to aggregate component carriers from different operating frequency bands. FIG. 1D illustrates an example of inter-band non-contiguous carrier aggregation in which two non-contiguous component carriers in the same operating frequency band (identified as band 2) are aggregated with a third component carrier in a different operating frequency band (identified as band 13).

Figure 1E:
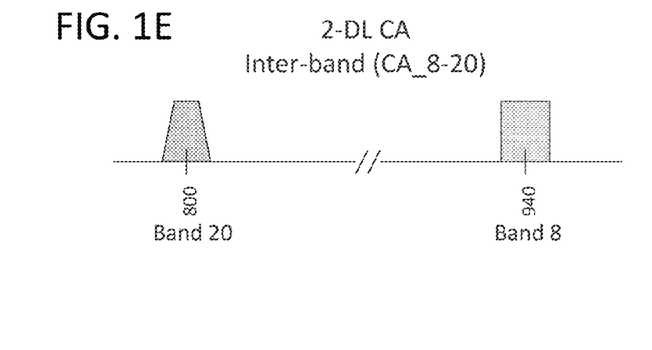
Figure 1F:
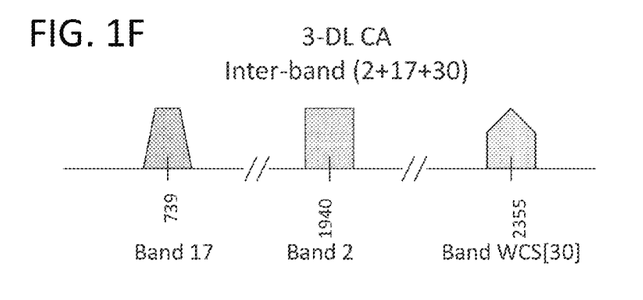

FIGS. 1E and 1F provide further examples of inter-band carrier aggregation schemes in which component carriers in different operating frequency bands are aggregated. FIG. 1E shows a two component carrier aggregation scheme in which a first component carrier in a first operating frequency band (identified as band 20) is aggregated with a second component carrier in a second operating frequency band (identified as band 8). FIG. 1F shows a three component carrier aggregation scheme in which first, second, and third component carriers, each of which is in a separate operating frequency band, are aggregated

SUMMARY

Some embodiments relate to a bandpass analog-to-digital converter (ADC) for use in RF receiver circuitry of a wireless communication device. The bandpass ADC comprises first noise-shaping successive approximation register (NS-SAR) circuitry arranged in a first path and second NS-SAR circuitry arranged in a second path parallel to the first path, wherein the first and second NS-SAR circuitries are configured to alternately sample an analog input voltage at a particular sampling rate.

Some embodiments relate to a wireless communication device including receiver circuitry configured to process an input signal comprising an intra-band non-contiguous carrier aggregated RF signal with two component carriers. The receiver circuitry comprises local oscillator circuitry configured to downconvert the input signal to an intermediate frequency; low-pass filter circuitry coupled to the output of the local oscillator circuitry; bandpass analog-to-digital converter (ADC) circuitry coupled to the output of the local oscillator circuitry; and digital IF circuitry coupled to the output of the bandpass ADC circuitry, wherein the digital IF circuitry is configured to downconvert the output of the bandpass ADC circuitry to baseband in the digital domain.

Some embodiments relate to a method of converting an analog input voltage to a digital voltage. The method comprises alternately sampling the analog input voltage onto a first capacitor digital to analog converter (DAC) and a second capacitor DAC; processing, using first noise-shaping circuitry, a residue voltage output from the first capacitor DAC to produce a first noise-shaped signal; processing, using second noise-shaping circuitry, a residue voltage output from the second capacitor DAC to produce a second noise-shaped signal; and outputting the digital voltage based, at least in part, on the first noise-shaped signal and/or the second noise-shaped signal.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Current wireless communication standards including, but not limited to, LTE, LTE-A, and WiFi, provide for carrier aggregation schemes to be used to increase the data throughput of data communications between nodes on the wireless communication network and wireless communication devices connected to the wireless communication network, as discussed above. The inventor has recognized that some conventional receiver circuitry in wireless communication (e.g., cellular) devices for processing carrier aggregated RF signals consume a substantial amount of power and/or occupy substantial chip area in the receiver circuitry. In particular, receiver circuitry used to process non-contiguous intra-band carrier aggregated signals, an example of which is shown in FIG. 1C, often uses dedicated receiver paths to process each of the component carriers in the aggregated signal. Some embodiments are directed to receiver circuitry for a wireless communication device that uses a single receiver path for processing intra-band non-contiguous carrier aggregated RF signals.

Figure 2:
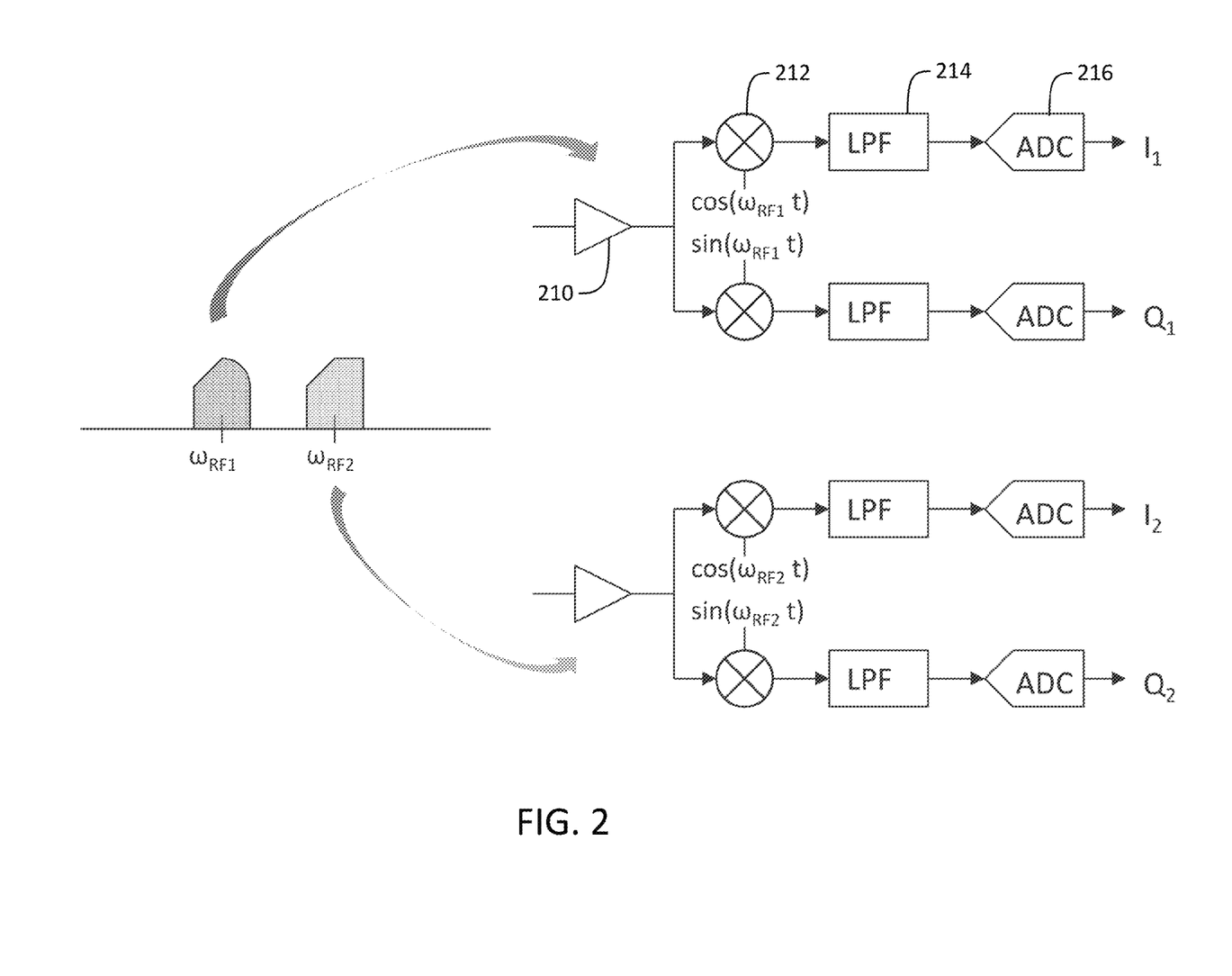
FIG. 2 shows a block diagram of an RF receiver architecture including two receiver paths, each of which separately processes component carrier information in a non-contiguous intra-band carrier aggregated RF signal.

In non-contiguous intra-band carrier aggregation, the component carriers to be aggregated are non-adjacent in the frequency spectrum and may even be located at opposite ends of an operating frequency band. To support such a carrier aggregation scheme, the information from each of the component carriers in the aggregated signal may be processed by dedicated receiver paths, an example of which is illustrated in FIG. 2. The receiver circuitry shown in FIG. 2 includes two zero intermediate frequency (zero-IF) receiver paths, each of which is used to process information from one of the two component carriers for an aggregated intra-band non-contiguous RF input signal.

In the upper receiver path of FIG. 2, the input RF signal is amplified by a low-noise amplifier 210. The signal is then downconverted to baseband using local oscillator circuitry 212. Local oscillator circuitry 212 downconverts the input signal using two mixers controlled in accordance with the center frequency ($\omega_{RF1}$) of a first component carrier of the two component carriers in the aggregated signal. The output of the local oscillator circuitry 210 is provided to a pair of low pass filters 214 and is further processed by two baseband ADCs 216 to convert the processed input analog voltage to a digital voltage output for the information in the first component carrier bandwidth.

The lower receiver path of the receiver circuitry shown in FIG. 2 includes identical circuitry as the upper path, with the local oscillator frequency ($\omega_{RF2}$) used to downconvert the input signal to baseband corresponding to the center frequency of the second component carrier in the aggregated input RF signal. Accordingly, the receiver circuitry of FIG. 2 includes two receiver paths, each of which includes its own local oscillator circuitry and two baseband ADCs. The inventor has recognized and appreciated that the receiver circuitry of FIG. 2 consumes substantial power and requires significant on-chip area. Some embodiments are directed to receiver circuitry for processing intra-band non-contiguous aggregated carrier RF signals that provides lower-power operation and/or can be accommodated using less chip area than conventional receiver circuitry for processing such RF signals.

Figure 3:
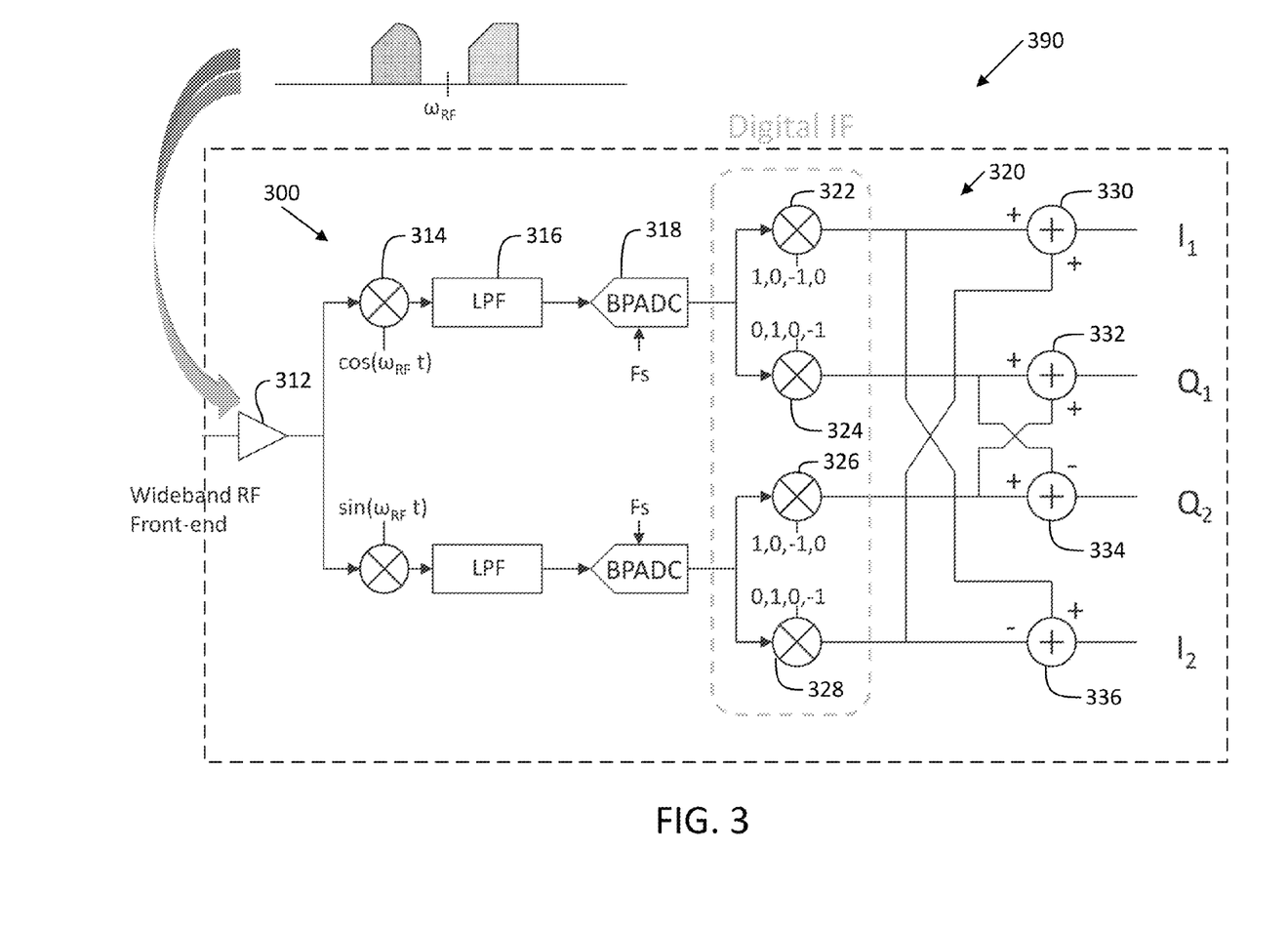
FIG. 3 shows a block diagram of an RF receiver architecture including a single receiver path for processing multiple component carriers in a non-contiguous intra-band carrier aggregated RF signal in accordance with some embodiments.

FIG. 3 shows receiver circuitry 300 for a wireless communication device 390 for processing an intra-band non-contiguous carrier aggregated RF signal in accordance with some embodiments. In circuitry 300, an RF signal is input and amplified by low-noise amplifier 312. Although shown as a single amplifier, it should be appreciated that low-noise amplifier 312 may be implemented in any suitable way to provide desired amplification of the input RF signal prior to processing by the receiver circuitry 300.

The output of low-noise amplifier 312 is sampled by a pair of mixers in local oscillator circuitry 314 using a single local oscillator frequency ($\omega_{RF}$), set as the midpoint between the center frequencies of the component carriers in the input RF signal. The single receiver path architecture eliminates one of the two receiver paths in the circuitry of FIG. 2, thereby reducing the power consumed by the circuitry and providing circuitry that occupies less on-chip area.

The demodulated signal output from the local oscillator circuitry 314 is filtered by a pair of low pass filters 316, followed by conversion from an analog signal to a digital signal using a pair of bandpass ADCs 318. The bandpass ADCs 318 digitize the signal at a sampling rate $F_S$ proportional to the intermediate frequency (IF) of the receiver. For example, in some embodiments, the sampling rate $F_S$ of the bandpass ADCs 318 may be set to IF*4. In some alternate embodiments, low pass filters 316 and bandpass ADCs 318 may be replaced with bandpass filters and wideband ADCs to provide digital outputs that may be further processed by digital IF circuitry.

The final downconversion to baseband is performed in the digital domain using digital IF circuitry 320 based on the digital signals output from bandpass ADCs 318. The digital IF circuitry 320 includes mixers 322, 324, 326, and 328 clocked to process and provide the outputs of bandpass ADCs 318 to integrating elements 330, 332, 334, and 336, at particular times as shown. The integrating elements integrate the outputs of the mixers to provide the digital output for each of the component carriers. By reducing the number of receiver paths from two to one and performing a portion of the downconversion in the digital domain using digital IF circuitry 320, some embodiments achieve savings in power and chip area by eliminating an entire local oscillator path and a baseband ADC pair as compared to conventional receive circuitry, an example of which is described above in connection with FIG. 2.

As discussed in connection with FIG. 3, receive circuitry 300 includes a pair of bandpass ADCs 318, which are used to sample and convert analog input voltages to digital output voltages that are further processed by digital IF circuitry 320. The inventor has recognized that conventional bandpass ADC architectures used in wireless communication device receiver circuitry typically include discrete-time delta sigma modulators (DSMs), which consume a substantial amount of power. Some discrete-time DSMs with bandwidths suitable for LTE (e.g., 10 MHz-25 MHz) include high-pass loop filters. The high-pass loop filters included in discrete-time DSMs use a substantial amount of power, especially for wide signal bandwidths, and have center frequencies that can only be tuned by adjusting the loop filter coefficients. For example, some discrete-time DSMs implement the high-pass loop filters by inverting or "chopping" the input and output of a low-pass filter at a center frequency $f_C$ to achieve the required high-pass response. However, when implemented in a discrete-time DSM, such an architecture typically requires switches with high linearity and associated clocking at the input of the DSM, which results in significant power usage. As discussed in more detail below, some embodiments are directed to bandpass ADC circuitry in which filter components including the choppers at the input and output of the low-pass filter are arranged in the ADC circuitry to allow for the use of simple switches that use less power and do not have the linearity constraints when implemented at the input of a discrete-time DSM.

Some embodiments are directed to bandpass ADC circuitry that incorporates noise-shaping successive approximation register (NS-SAR) circuitry that uses less power than the discrete-time DSMs in conventional bandpass ADC circuitry. In particular, some embodiments are directed to a clock tunable bandpass ADC using a two-path architecture, where each path includes a noise-shaping successive approximation register (NS-SAR) that replaces the DSM in conventional bandpass ADC architectures.

Figure 4:
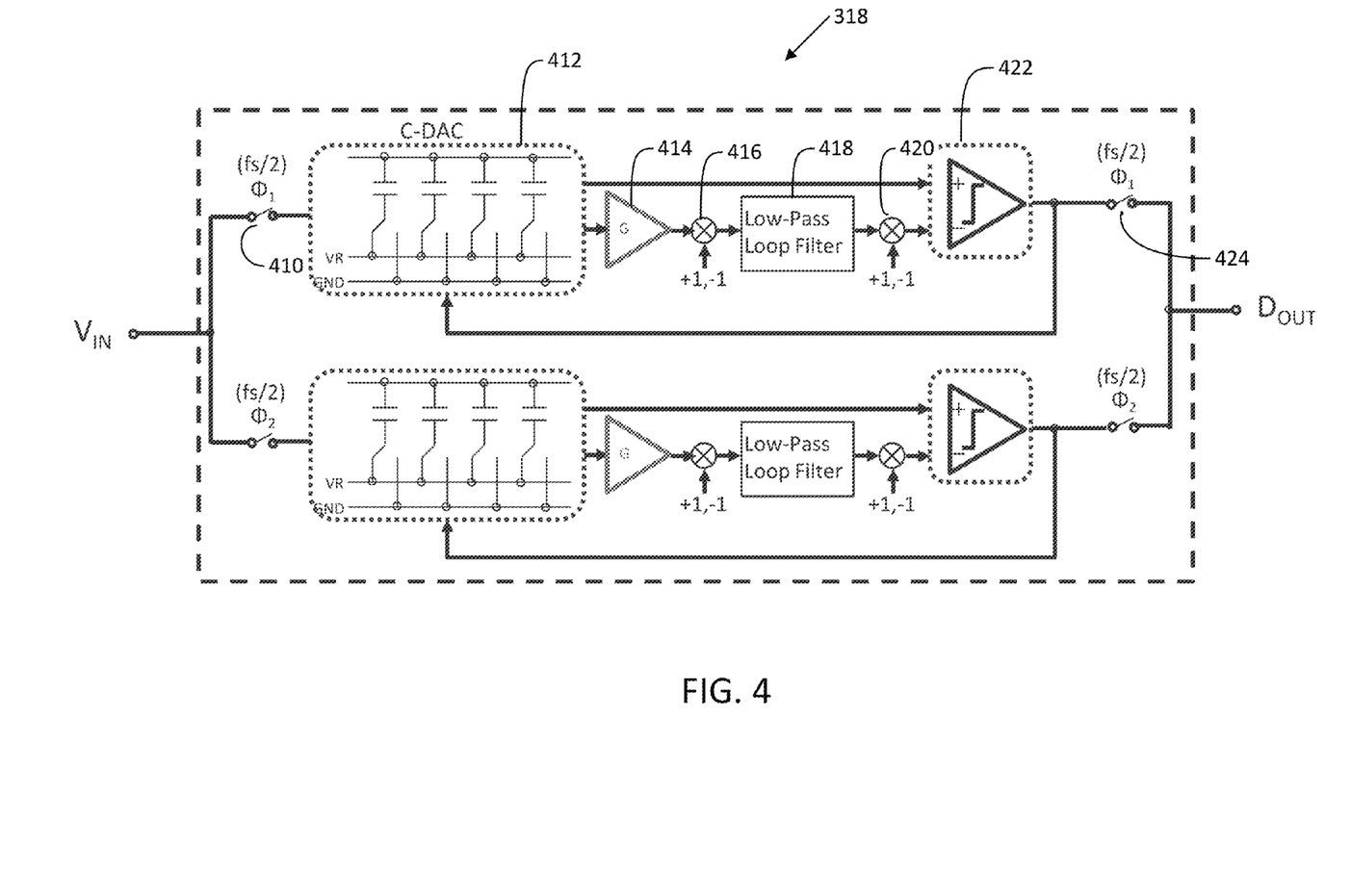
FIG. 4 shows a block diagram of a bandpass analog-to-digital converter (ADC) for use in the receiver architecture of FIG. 3 in accordance with some embodiments.

FIG. 4 shows an example of circuitry that may be used for bandpass ADCs 318 in receive circuitry 300 shown in FIG. 3, in accordance with some embodiments. The bandpass ADC 318 receives an analog voltage input $V_{IN}$ as the output of a low pass filter 316, as discussed above in connection with FIG. 3. The input voltage is sampled by a pair of switches 410 in a time-interleaved manner to provide input to each of the two paths in the ADC circuitry. The oversampling ratio (OSR) of the ADC circuitry is defined as $F_S/(2*BW)$, and varies depending on the intermediate frequency (IF) of the receiver, also referred to herein as center frequency $f_C$. The center frequency $f_C$ relates to the local oscillator frequency $\omega_{RF}$ in accordance with the following relation $f_C = abs(\omega_{RF} - \omega_1)$, where $\omega_{RF}$ is set at the midpoint between the two component carrier frequencies and $\omega_1$ is one of the component carrier frequencies. The two path architecture shown in FIG. 4 results in the center frequency, $f_C$ being fixed to a quarter of the sampling frequency (i.e., $f_C = F_S/4$) allowing for accurate tuning of $f_C$ by adjusting $F_S$.

Each path in the two-path architecture includes a capacitor DAC (C-DAC) that samples the input at a sampling rate of $F_S/2$ using switches 410 thereby alternately sampling the input analog signal into each of the paths of the ADC circuitry. In some embodiments the C-DACs are implemented as 10-bit asynchronous top-plate sampling SARs. Other SAR architectures, such as synchronous bottom plate sampling, may alternatively be used, and embodiments are not limited in this respect. An SAR algorithm, examples of which are known in the art, may be executed after sampling the input voltage onto the C-DACs. As shown, each C-DAC provides two outputs including a main SAR output voltage and a residue voltage, which represents the quantization error after a SAR conversion cycle is complete. The main SAR voltage is coupled to a first terminal of SAR comparator 422, while the residue voltage is processed by noise-shaping circuitry including mixers 416 and 420, and low-pass filter 418, as described in more detail below.

Noise-shaping circuitry is arranged in each path of the bandpass ADC circuitry 318 shown in FIG. 4. The noise-shaping circuitry provides for a bandpass noise transfer function which reduces quantization noise in the frequency range of interest. The inventor has recognized that the thermal (kT/C) noise introduced by the noise-shaping circuitry may be mitigated, at least in part, by amplifying the residue voltage output from the C-DAC by a gain factor G using a low-gain amplifier 414. For the two-path architecture shown in FIG. 4, the quantization noise is minimized at $F_S/4$. Accordingly, in some embodiments, the center frequency of $f_C$ may be set to $F_S/4$, to minimize the quantization noise at this frequency, thereby providing an optimum signal-to-noise ratio for the bandpass ADC circuitry.

Use of low-gain amplifier 414 also has other advantages including, but not limited to, lower power consumption. For example, amplifier 414 need only be powered on when the residue voltage output from the C-DAC is transferred to the noise-shaping circuitry. Accordingly, the amplifier may remain powered down for most of the time, resulting is significant power savings. In some embodiments, the low-gain amplifier 414 is implemented as a simple resistively loaded differential pair. However, it should be appreciated that other types of low-gain amplifier architectures may also be used, and embodiments are not limited in this respect.

The output of amplifier 414 is provided to mixer 416, which inverts or "chops," the voltage at a rate $F_S/2$. The output of the mixer 416 is passed to a low-pass loop filter 418, the output of which is chopped again by mixer 420. Insertion of mixers 416 and 420 at the input and output of the low-pass filter 418 transform the low-pass response to a high-pass response. Arrangement of the filtering circuitry inside of the NS-SAR path provides advantages not achievable when the filtering circuitry is arranged at the input of a discrete-time DSM, as discussed above. For example, in some embodiments, each of the mixers 416, 420 in the bandpass ADC circuitry 318 is implemented as a transmission gate switch. Because the residue signal output from the C-DAC is relatively small, precise linearity of the switches used for the mixers is not required, as was the case when the switches were implemented at the input of a discrete-time DSM.

The inverted signal output from mixer 420 is provided to a first (e.g. negative) input of SAR comparator 422, while the main SAR output from the C-DAC is provided to a second (e.g., positive) input of SAR comparator 422, as discussed above. In some embodiments, SAR comparator 422 is implemented by a double-tail sense-amp dynamic comparator.

The inventor has recognized that C-DAC has mismatch errors that limit the performance of the bandpass ADC. To fix the mismatch errors, a digital correction or calibration may be applied to the C-DAC using feedback from the SAR comparator 422, as shown in FIG. 4. In order to improve power efficiency, it is desirable to reduce the size of the C-DAC down to the fundamental level as set by thermal (kT/C) noise requirements. However, doing so typically results in too much mismatch error. The calibration provided as feedback from the SAR comparator 422 to the C-DAC provides a digital correction of the C-DAC mismatch errors to allow the capacitor to be sized based on kT/C noise rather than linearity. The output of the SAR comparators 422 in each of the two paths is sampled at a rate of $F_S/2$ using switches 424 to provide a digital output $D_{OUT}$ having desired bandpass noise transfer function characteristics.

By moving the chopping operation from the input of ADC to the residue output of the C-DAC where the signal is small and high-linearity switches are not required, the bandpass ADC circuitry described in connection with FIG. 4 achieves a wide bandwidth response with a lower OSR resulting in an overall lower power operation.

Although the bandpass ADC circuitry described herein has been described as being used in receiver circuitry for processing an intra-band non-contiguous carrier aggregated RF signal having only two component carriers (e.g., see FIG. 1C), it should be appreciated that the circuitry described herein may be used in receiver circuitry for processing other types of carrier aggregated RF signals as well. For example, in the carrier aggregation scheme illustrated in FIG. 1D in which three component carriers, two intra-band and one inter-band carrier, are aggregated, embodiments described herein may be used to process the two intra-band component carriers, with the other carrier being processed using other circuitry.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A bandpass analog-to-digital converter (ADC) for use in RF receiver circuitry of a wireless communication device, the bandpass ADC comprising:
   first noise-shaping successive approximation register (NS-SAR) circuitry arranged in a first path; and
   second NS-SAR circuitry arranged in a second path parallel to the first path, wherein the first and second NS-SAR circuitries are configured to alternately sample an analog input voltage at a particular sampling rate.

2. The bandpass ADC of claim 1, wherein each of the first NS-SAR circuitry and the second NS-SAR circuitry includes:
   a capacitor digital to analog converter (DAC) onto which the analog input voltage is sampled;
   noise-shaping circuitry arranged to process a residue voltage output from the capacitor DAC; and
   an SAR comparator arranged to receive the output of the noise-shaping circuitry.

3. The bandpass ADC of claim 2, wherein the noise-shaping circuitry comprises a low-noise amplifier and loop filter circuitry, wherein the low-noise amplifier is arranged to amplify the residue voltage output from the capacitor DAC, and wherein the loop filter circuitry is arranged between the output of the low-noise amplifier and an input of the SAR comparator.

4. The bandpass ADC of claim 3, wherein the loop filter circuitry comprises:
   low-pass loop filter circuitry;
   first inverter circuitry arranged between the low-noise amplifier and an input of the low-pass loop filter circuitry; and
   second inverter circuitry arranged between an output of the low-pass loop filter circuitry and the input of the SAR comparator.

5. The bandpass ADC of claim 4, wherein each of the first inverter circuitry and the second inverter circuitry comprise a transmission gate switch.

6. The bandpass ADC of claim 3, wherein the low-noise amplifier is configured to be powered on only during transfer of the residual voltage to the loop filter circuitry.

7. The bandpass ADC of claim 2, wherein the first NS-SAR circuitry includes a feedback path from the output of the SAR comparator to the capacitor DAC.

8. The bandpass ADC of claim 2, wherein the SAR comparator includes a first input and a second input, wherein the SAR comparator is arranged to receive the output of the noise-shaping circuitry at the first input and output of the capacitor DAC at the second input.

9. The bandpass ADC of claim 1, further comprising a first switch arranged at the output of the first NS-SAR circuitry and a second switch arranged at the output of the second NS-SAR circuitry, wherein the first switch and the second switch are configured to alternately sample the output of the first and second NS-SAR circuitries at the particular sampling frequency to generate digital output.

10. A wireless communication device including receiver circuitry configured to process an input signal comprising an intra-band non-contiguous carrier aggregated RF signal with two component carriers, the receiver circuitry comprising:
    local oscillator circuitry configured to downconvert the input signal;
    low-pass filter circuitry coupled to the output of the local oscillator circuitry;
    bandpass analog-to-digital converter (ADC) circuitry coupled to the output of the low-pass filter circuitry and configured to sample the filtered output of the low-pass filter circuitry at a sampling frequency proportional to an intermediate frequency of the receiver circuitry; and
    digital circuitry coupled to the output of the bandpass ADC circuitry, wherein the digital circuitry is configured to downconvert the output of the bandpass ADC circuitry to baseband in the digital domain.

11. The wireless communication device of claim 10, wherein the local oscillator circuitry is further configured to downconvert the input signal using a local oscillator frequency equal to a frequency between center frequencies of the two component carriers.

12. The wireless communication device of claim 10, wherein the digital circuitry comprises a plurality of mixers configured to process the output of the bandpass ADC circuitry at different timings to downconvert the bandpass ADC output to baseband.

13. The wireless communication device of claim 10, further comprising wideband RF amplification circuitry arranged to amplify the input signal prior to downconverting the input signal with the local oscillator circuitry.

14. The wireless communication device of claim 10, wherein the bandpass ADC circuitry comprises a plurality of noise-shaping successive approximation register (NS-SAR) circuitry paths arranged in parallel.

15. The wireless communication device of claim 14, wherein at least one of the NS-SAR circuitry paths comprises:
    a capacitor digital-to-analog converter (DAC) onto which an analog input voltage is sampled;
    noise-shaping circuitry arranged to process a residue voltage output from the capacitor DAC; and
    an SAR comparator arranged to receive the output of the noise-shaping circuitry.

16. A method of converting an analog input voltage to a digital voltage, the method comprising:
    alternately sampling the analog input voltage onto a first capacitor digital to analog converter (DAC) and a second capacitor DAC;
    processing, using first noise-shaping circuitry, a residue voltage output from the first capacitor DAC to produce a first noise-shaped signal;
    processing, using second noise-shaping circuitry, a residue voltage output from the second capacitor DAC to produce a second noise-shaped signal; and
    outputting the digital voltage based, at least in part, on the first noise-shaped signal and/or the second noise-shaped signal.

17. The method of claim 16, wherein processing the residue voltage output from the first capacitor DAC comprises:
   amplifying the residue voltage;
   inverting the amplified residue voltage;
   filtering the inverted residue voltage; and
   inverting the filtered residue voltage to produce the first noise-shaped signal.

18. The method of claim 17, wherein filtering the inverted residue voltage comprises filtering the inverted residue voltage using a low-pass loop filter.

19. The method of claim 16, further comprising:
   comparing the first noise-shaped signal to a main output from the first capacitor DAC to produce a first compared signal;
   comparing the second noise-shaped signal to a main output from the second capacitor DAC to produce a second compared signal; and
   wherein outputting the digital voltage comprises alternately sampling the first compared signal and the second compared signal to output the digital voltage.

20. The method of claim 19, further comprising:
   providing feedback based on the first compared signal to the first capacitor DAC.

* * * * *